United States Patent [19]

Wakabayashi et al.

[11] Patent Number: 5,108,950
[45] Date of Patent: Apr. 28, 1992

[54] METHOD FOR FORMING A BUMP ELECTRODE FOR A SEMICONDUCTOR DEVICE

[75] Inventors: Takeshi Wakabayashi, Hidaka; Akira Suzuki, Musashino; Shigeru Yokoyama, Chofu, all of Japan

[73] Assignee: Casio Computer Co., Ltd., Tokyo, Japan

[21] Appl. No.: 617,399

[22] Filed: Nov. 20, 1990

Related U.S. Application Data

[60] Continuation of Ser. No. 385,207, Jul. 25, 1989, abandoned, which is a division of Ser. No. 226,937, Aug. 1, 1988, abandoned.

[30] Foreign Application Priority Data

| Nov. 18, 1987 | [JP] | Japan | 62-289257 |
| Nov. 24, 1987 | [JP] | Japan | 62-294133 |
| Apr. 27, 1988 | [JP] | Japan | 63-105302 |

[51] Int. Cl.⁵ .................................... H01L 21/60
[52] U.S. Cl. .................................... 437/183; 437/190; 437/203; 437/228; 437/231; 437/977; 148/DIG. 131; 148/138
[58] Field of Search ............... 437/183, 190, 203, 231, 437/228, 977; 148/DIG. 131, DIG. 138

[56] References Cited

U.S. PATENT DOCUMENTS

| 3,689,991 | 9/1972 | Aird | 318/805 |
| 4,293,637 | 10/1981 | Hatada et al. | 437/183 |
| 4,742,023 | 5/1988 | Hasegawa | 437/183 |
| 4,782,380 | 11/1988 | Shankar et al. | 357/71 |
| 4,816,424 | 3/1989 | Watanabe et al. | 437/190 |

FOREIGN PATENT DOCUMENTS

| 0065663 | 6/1978 | Japan | 437/183 |
| 0080161 | 7/1978 | Japan | 437/183 |
| 55-0140238 | 11/1980 | Japan | |
| 0197838 | 12/1982 | Japan | |
| 0143554 | 8/1983 | Japan | 437/183 |
| 0161346 | 9/1983 | Japan | 437/183 |
| 0217646 | 10/1985 | Japan | 437/183 |

OTHER PUBLICATIONS

Ghandhi, "VLSI Fabrication Principles", 1983, pp. 475-517.

Primary Examiner—Brian E. Hearn
Assistant Examiner—Tuan Nguyen
Attorney, Agent, or Firm—Frishauf, Holtz, Goodman & Woodward

[57] ABSTRACT

A bump electrode structure of a semiconductor device comprises an electrode pad formed of an aluminum alloy, an insulating oxide layer covering only the peripheral edge portion of the electrode pad, an under-bump layer formed of an alloy of titanium and tungsten, and a bump electrode formed of gold. The titanium-tungsten alloy functions both as a barrier metal and as a bonding metal. The bump electrode rises substantially straight from the bonding surface of the under-bump layer, and its top portion has an area only substantially equal to that of the electrode pad. Fine V-shaped grooves are formed on the top surface of the bump electrode by anisotropic etching. Thus, the semiconductor device with fine electrode pad pitches is provided with a high-reliability bump electrode structure which ensures sufficient bonding strength between internal and external electrodes.

14 Claims, 6 Drawing Sheets

METHOD FOR FORMING A BUMP ELECTRODE FOR A SEMICONDUCTOR DEVICE

This application is a continuation of application Ser. No. 07/385,207, filed Jul. 25, 1989, abandoned, which is a division of Ser. No. 226,937, filed Aug. 1, 1988, abandoned.

BACKGROUND OF THE INVENTION

1. Field of the Invention

The present invention relates to a bump electrode structure of a semiconductor device and a method for forming the same.

2. Description of the Related Art

Conventionally known is a bonding system in which bump electrodes are formed in a semiconductor device, and are bonded directly to metal leaf leads which are attached to a carrier tape. This system is the so-called TAB (tape automated bonding) system which has been known fairly long. With the rapid progress of the photolithography, along with the demand for the miniaturization of electronic apparatuses, the TAB system has recently started to be revaluated favorably. After all, the most essential technical factor of this system lies in that the bump electrodes are formed in the semiconductor device.

FIG. 8 is a sectional view of a prior art bump electrode structure. In FIG. 8, numeral 1 denotes a silicon wafer, on which is formed electrode pad 2 composed of aluminum or aluminum alloy. Pad 2 is connected with internal electrodes of wafer 1, such as gates (not shown). The peripheral edge portion of electrode pad 2 is covered by insulating layer 3 of silicon nitride or the like, through which opening 3a is bored facing the pad. Formed on electrode pad 2 is under-bump layer 4 which is composed of barrier metal layer 4a and bonding metal layer 4b. Layer 4 is formed by vacuum evaporation or sputtering. In FIG. 8, layer 4 is shown as being located only on electrode pad 2 and that portion of insulating layer 3 surrounding the pad. In an actual process, however, under-bump layer 4 is etched as illustrated after layer 4 is formed over the whole surface of insulating layer 3 and bump electrode is formed. In this case, layer 4 is adhered to both electrode pad 2 and the portion of insulating layer 3 laminated to the pad 2. Satisfactory bonding strength can be ensured if the area for the adhesion is wide. Gold bump electrode 5 is formed on under-bump layer 4 by plating. As a foundation layer for the plating, thin gold layer 5a is formed on bonding metal layer 4b. Using bump electrode 5 as a mask, thereafter, that portion of under-bump layer 4 outside electrode 5 is removed by etching, as mentioned before. Usually, isotropic wet etching is used for this purpose.

According to the prior art arrangement described above, however, bump electrode 5 is shaped like a top-heavy mushroom, so that electrode pad pitches are inevitably wide. It is difficult, therefore, to apply this arrangement to recent semiconductor devices whose electrode pads 2 have very narrow widths (or diameters) and pitches. As the widths or diameters of the electrode pads become finer, there is an increasing demand for the development of a technique to form fine bump electrodes. The most important problem of this development is how to secure the bonding strength between the electrode pads and the under-bump layers, between the under-bump layers and the bump electrodes, and further between the bump electrodes and external lead terminals bonded thereto, when the top width (or diameter) of the bump electrodes is reduced.

SUMMARY OF THE INVENTION

Accordingly, a first object of the present invention is to provide a bump electrode structure of a semiconductor device, capable of being bonded to a fine electrode pad with sufficient strength and with high reliability, and a method for forming the same.

A second object of the invention is to provide a bump electrode structure of a semiconductor device, which permits improved bonding strength per unit area of a bump electrode, and a method for forming the same.

In order to achieve the first object, a bump electrode structure of a semiconductor device according to the present invention comprises: an electrode pad; an insulating layer having an opening through which the electrode pad is exposed and covering the peripheral edge portion of the electrode pad; an under-bump layer bonded to the electrode pad exposed through the opening of the insulating layer, the under-bump layer having a single-layer structure composed of an alloy of a barrier metal and a bonding metal, the peripheral edge portion of the under-bump layer being situated between the respective peripheral edge portions of the opening of the insulating layer and the electrode pad; and a protuberant bump electrode bonded to the under-bump layer and raised from the peripheral edge portion of the under-bump layer. In order to achieve the second object, moreover, a bump electrode structure of a semiconductor device according to the invention is constructed so that a bump electrode is bonded to an electrode pad with an under-bump layer therebetween, and fine V-shaped grooves are formed on the top surface of the bump electrode by anisotropic etching.

BRIEF DESCRIPTION OF THE DRAWINGS

These and other objects and features of the present invention will be better understood from the following detailed description taken in conjunction with the accompanying drawings, in which.

DETAILED DESCRIPTION OF THE PREFERRED EMBODIMENTS

An embodiment of the present invention will now be described in detail with reference to the accompanying drawings.

Figure 1:
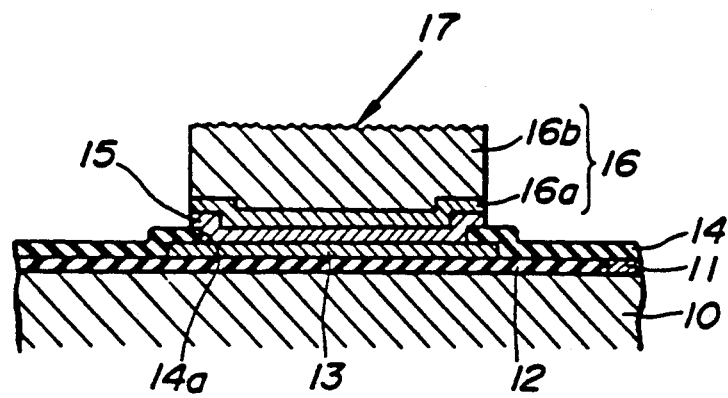
FIG. 1 is an enlarged sectional view showing a bump electrode structure.

FIG. 1 shows a bump electrode structure of a semiconductor device. In FIG. 1, numeral 10 denotes a silicon wafer, which usually has a diameter of 4 to 8 inches. Internal electrode 11, such as the gate of a transistor, and insulating layer 12 of silicon oxide are formed on wafer 10. Layer 12 carries thereon electrode pad 13 which is connected to electrode 11. Pad 13 is formed of aluminum or an aluminum alloy, such as aluminum-silicon, aluminum-copper-silicon, etc. Insulating layer 14 of silicon nitride or the like is formed on insulating layer 12 and the peripheral edge portion of electrode pad 13. Opening 14a is bored in the portion of layer 14 which corresponds to pad 13. Intermediate junction layer (under-bump layer) 15 is formed on the pad 13 facing opening 14a and the portion of layer 14 covering the peripheral edge portion of pad 13. Layer 15 is formed of an alloy of barrier metal and bonding metal, e.g., titanium-tungsten, platinum-titanium, palladium-titanium, etc. Such an alloy of barrier metal and bonding metal, although single-layered, combines a barrier function with a function to secure the bonding strength of gold bump 16b and electrode pad 13. Preferably, junction layer 15 is formed of a titanium-tungsten alloy containing 30% of titanium by weight, or 10% by atomic weight. This alloy is deposited to a thickness of several thousands of angstroms by sputtering. The outer end of intermediate junction layer 15 is situated between the outer end of electrode pad 13 and opening 14a of insulating layer 14. Bump electrode 16 of gold is projectingly formed on layer 15. Electrode 16, which is composed of thin gold layer 16a and gold bump 16b, has an overall thickness of about 10 to 25 $\mu$m. The outer peripheral edge of electrode 16 is substantially flush with that of junction layer 15.

Thin gold layer 16a is a foundation layer on which gold bump 16b is formed by plating, and is deposited on intermediate junction layer 15 by sputtering. Fine V-shaped grooves 17 are formed on the top surface of bump 16b.

Referring now to FIGS. 2A to 2E, a method for forming bump electrode 16 on silicon wafer 10 will be described.

Figure 2A:
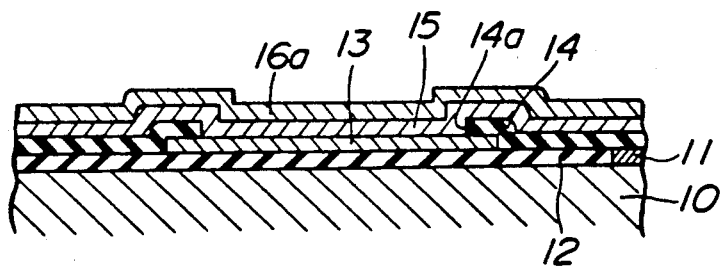
FIGS. 2A to 2E are enlarged sectional views showing various forming processes.

First, internal electrode 11 and insulating layer 12 of silicon oxide are formed on silicon wafer 10, and electrode pad 13 of aluminum or aluminum alloy is formed on layer 12, as shown in FIG. 2A. Then, insulating layer of silicon nitride is formed over pad 13 and layer 12. Opening 14a, which is a little smaller than electrode pad 13, is bored in layer 14 by etching so that pad 13 is exposed through opening 14a. In this state, an alloy for intermediate junction, e.g., titanium-tungsten alloy, and gold are sputtered in succession. By doing this, intermediate junction layer 15 and thin gold layer 16a are formed to a thickness of several thousands of angstroms each, over the whole surface of electrode pad 13 and insulating layer 14 which are overlaid on silicon wafer 10. Alternatively, the thickness of thin gold layer 16a may be hundreds of angstroms. In this case, sputtering is the best method to make the distribution of deposited metal particles uniform. Before executing this process, aluminum oxide film is removed as required.

Figure 2B:
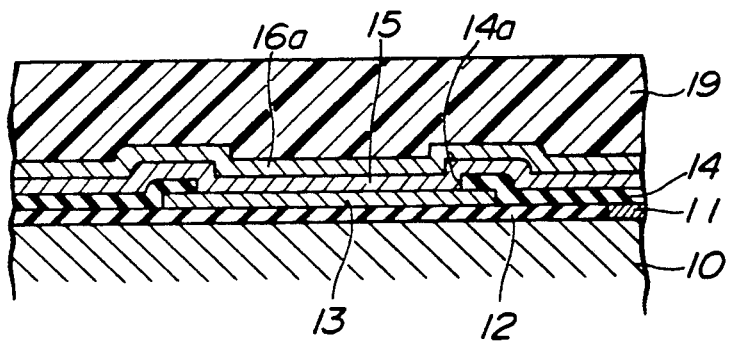

Thereafter, a liquid photoresist is dropped on thin gold layer 16a to form photoresist layer 19 thick by spin coating, as shown in FIG. 2B. To obtain a thickness of about 20 to 30 $\mu$m, layer 19 is formed of a photoresist (e.g., BMR-1000 from Tokyo Oka Kogyo Co., Ltd.) whose viscosity, ranging from hundreds of centipoises to approximately a thousand CPS, is several times to tens of times that of a photoresist adapted for ordinary spin coating. The rotating speed used is hundreds of rpm. In this case, the predetermined thickness cannot be obtained if the viscosity of the photoresist is less than a hundred CPS.

The photoresist should be selected in consideration of the depth of exposure in an exposure process besides the viscosity characteristic for the predetermined layer thickness. More specifically, if the thickness of the photoresist layer is increased, then the difference in the amount of exposure between upper and lower portions of the layer increases in proportion. Thus, it is difficult to develop the lower portion of the layer. Also for this reason, the thickness of the conventional photoresist layer is adjusted to several micrometers. It was ascertained, however, that the requirement for this exposure characteristic can be perfectly fulfilled by the aforesaid BMR-1000.

Figure 2C:
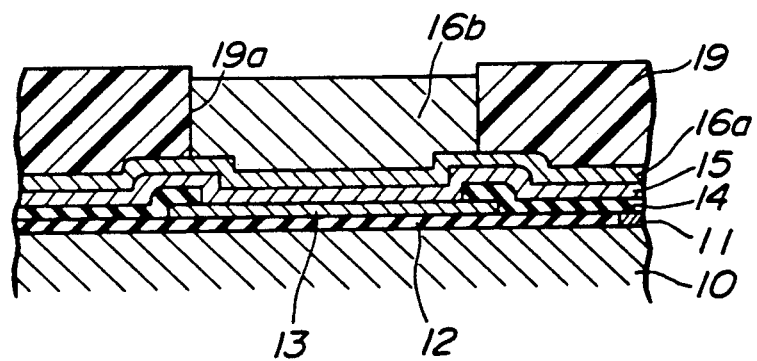

Subsequently, photoresist layer 19 thus obtained is dried, and a mask (not shown) is then aligned on the top surface of layer 19. A light transmitting portion of the mask has a size such that its outer peripheral edge portion is situated between the respective outer peripheral edge portions of electrode pad 13 and opening 14a of insulating layer 14. Photoresist layer 19 is exposed through the mask and developed, whereby opening 19a is bored through layer 19, as shown in FIG. 2C. Preferably, opening 19a should be square in shape, instead of being circular, as mentioned later. Then, the portion of thin gold layer 16a exposed through opening 19a is electroplated with gold, thereby forming gold bump 16b. Bump 16b is raised to a thickness of about 20 to 30 $\mu$m such that its top surface does not project above that of photoresist layer 19. Thus, the top surface of bump 16b is formed substantially flat. An organic solvent (e.g., C-3 from Tokyo Oka Kogyo Co., Ltd.) consisting essentially of xylene is used as a developing solution for developing photoresist layer 19.

Figure 8:
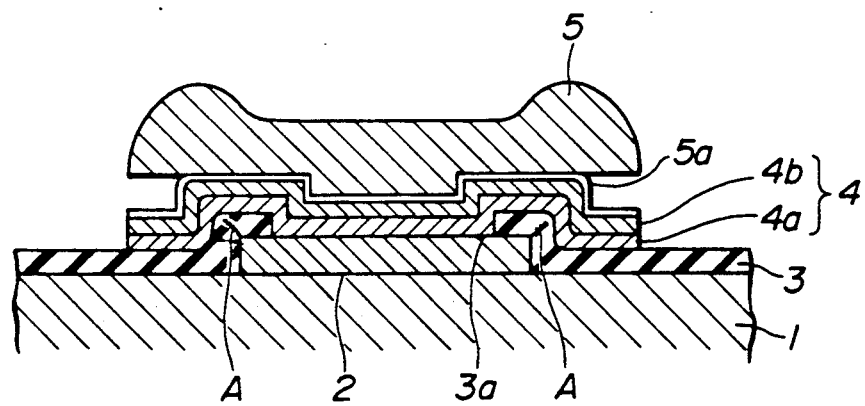
FIG. 8 is a sectional view of a prior art bump electrode structure.

In general, the plating speed is isotropic in a region exposed from a photoresist layer. This point will be explained in connection with a prior art structure shown in FIG. 8. Conventionally, the thickness of the photoresist layer is several micrometers, as mentioned before, so that a plating must be piled up on the photoresist layer in order to give the thickness of 10 to 25 $\mu$m to bump electrode 5. According to such an arrangement, however, a plating formed on the photoresist layer spreads in all directions at equal speeds. As shown in FIG. 8, the plating rises at the outer peripheral edge portion of bump electrode 5 and depressed in the center. The top surface of bump electrodes 5, therefore, cannot be formed flat. Thus, sufficient bonding strength cannot be obtained for the connection of external lead terminals. According to the present invention, however, the plating is restricted within the range of the thickness of photoresist layer 19, so that the top surface of bump electrode 16 can be made substantially flat.

Figure 3:
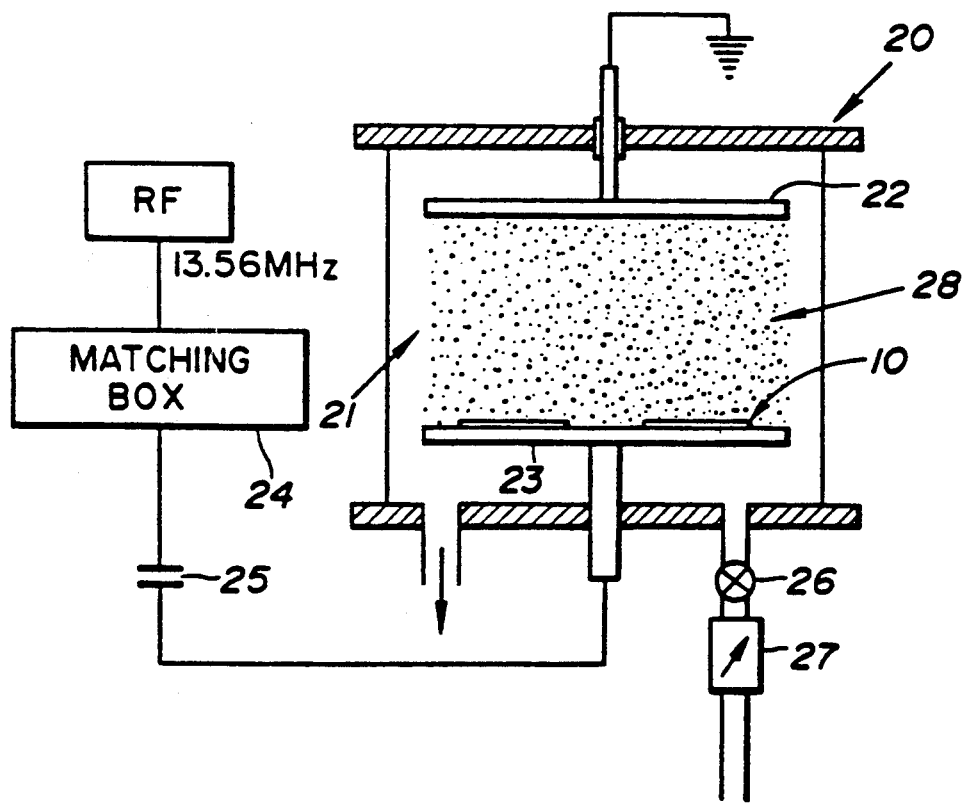
FIG. 3 is a sectional view of an etching apparatus used in forming a bump electrode according to the present invention.
Figure 2D:
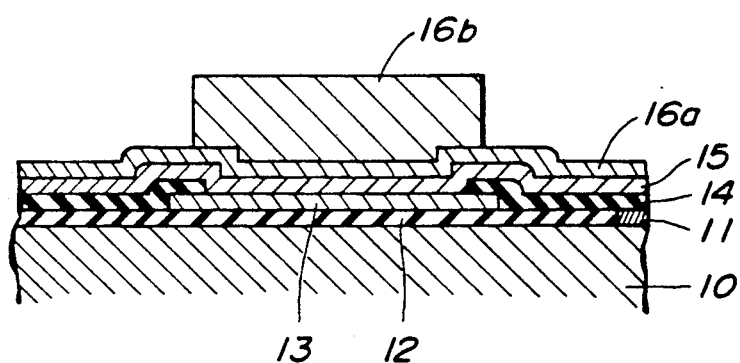
Figure 2E:
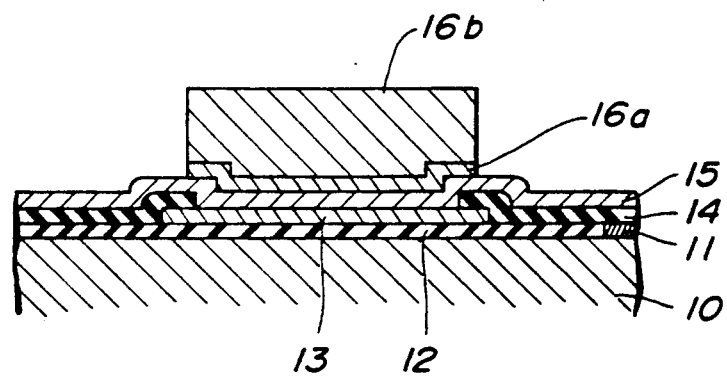

Subsequently, photoresist layer 19 is removed by means of an organic solvent (e.g., Remover SP from Tokyo Oka Kogyo Co., Ltd.) consisting essentially of ethyl cellasolve and dichlorobenzene, as shown in FIG. 2D. In this state, thin gold layer 16a is etched by means of an iodine-based etching solution so that an unnecessary portion thereof, which does not correspond to gold bump 16b, is removed. FIG. 2E shows this situation. Thereafter, silicon wafer 10 is introduced into sputtering (etching) apparatus 20 shown in FIG. 3 to be subjected to reactive-ion (sputter) etching. Although wafer 10 is shown only partially in the enlarged views of the bump electrode structure, it actually is in the form of a disk with a diameter of 4 to 8 inches. In apparatus 20, plates 22, 23 are arranged in vacuum chamber 21, and wafer 10 is placed on plate 23. A high-frequency signal of 13.56 MHz is applied to plate 23 through matching box 24 and block capacitor 25. The inside of vacuum chamber 21 is kept at a high vacuum by means of a vacuum pump (not shown). When valve 26 is opened, reactive ion gas 28 is introduced into chamber 21. The inside of chamber 21 is adjusted to a gas pressure of 15 to 30 Pa (Pascal: 1 Pa = 1/133 Torr) by measuring the amount of introduction of gas 28 by means of flow meter 27 and controlling the operation of valve 26. A gas mixture of halide gas and chlorine-based gas is used as the reactive ion gas. The halide gas used may be $CF_4$, $C_2F_6$, $C_3F_8$, $CHF_3$, or $SF_6$, while the chlorine-based gas used may be $CF_3Cl$, $CF_2Cl_2$, $CFCl_3$, $Cl_2$, $SiCl_4$, $BCl_3$, $HCl$, or $CCl_4$. A combination of $SF_6$ and $CFCl_3$ may be given as a typical example.

If the reactive-ion etching is performed under the aforementioned conditions, intermediate junction layer 15 and gold bump 16b are subjected to a sputtering effect of reactive ions, and anisotropic etching advances. In this case, bump 16b is so much thicker than junction layer 15 that the fine, relatively deep V-shaped grooves are formed on the top surface of bump 16b, while layer 15 is removed entirely.

Figure 6:
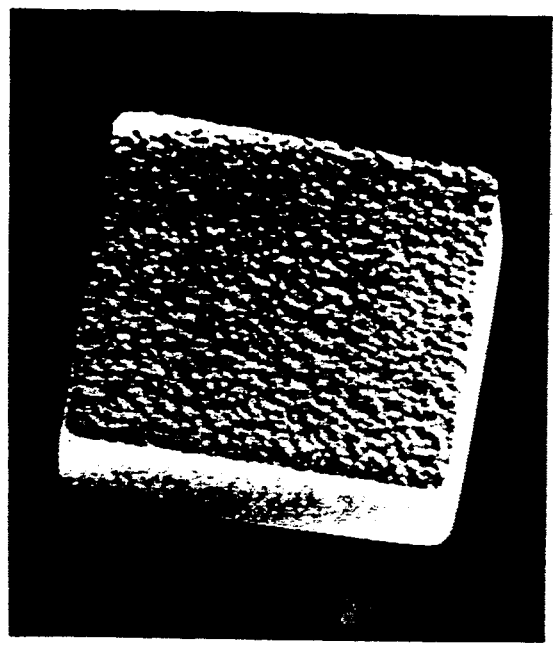
FIG. 6 shows a photomicrograph of a bump electrode before reactive-ion etching.
Figure 7:
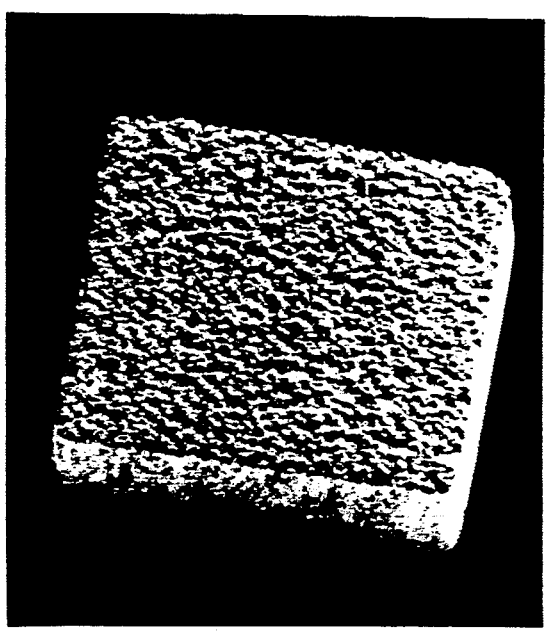
FIG. 7 shows a photomicrograph of the bump electrode after the reactive-ion etching.

FIG. 6 shows a photomicrograph of gold bump 16b in the state of FIGS. 2C to 2E obtained when the bump is plated. For a wider cross-sectional area, it is advisable to make bump 16b square in shape, not circular. Fine indentations and projections are observed on the top surface of bump 16b shown in FIG. 6. In this state, the projections have spherical edges. FIG. 7 shows a photomicrograph of gold bump 16b in the state of FIG. 1 obtained after the reactive-ion etching. In this state, fine sharp projections are observed on the top surface of bump 16b.

This comparison indicates that the configuration of the top surface of gold bump 16b after the reactive-ion etching is quite different from that obtained before the etching.

Figure 4:
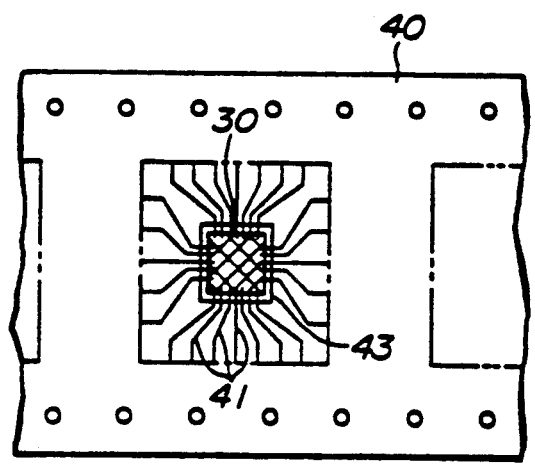
FIG. 4 is a plan view showing a semiconductor chip mounted on a tape carrier.
Figure 5:
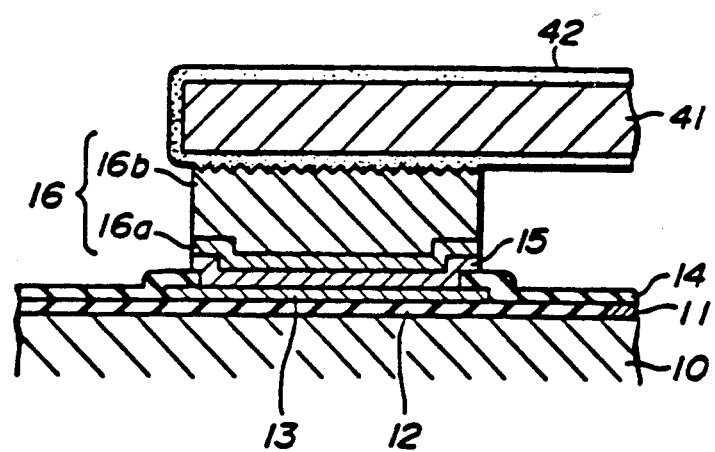
FIG. 5 is an enlarged sectional view showing a finger lead bonded to the bump electrode shown in FIG. 1.

Referring now to FIGS. 4 and 5, we will describe the way external lead terminals are connected to the bump electrode of the semiconductor device constructed in this manner.

First, silicon wafer 10 is diced into a plurality of semiconductor chips 30. A number of (50~200) external electrodes 16 are arranged on each of chips 30. Finger leads (external lead terminals) 41 are formed by laminating tape carrier 40 with copper foil and then shaping the resulting structure by etching. Each of leads 41 is plated with solder 42. One end of each finger lead projects to inside of rectangular opening 43 which is bored through the center of tape carrier 40. The respective projected end portions of leads 41 are arranged corresponding to bump electrodes 16 of semiconductor chip 30. In this case, solder 42, with which the surface of each of finger leads 41 is plated, is formed of an alloy of tin and lead in the ratio of 8 to 2, and has a thickness of about 0.2 and 0.6 μm.

In connecting finger leads 41 to bump electrodes 16 of semiconductor chip 30, leads 41 are thermo compressed to their corresponding electrodes 16. This thermo compression is performed with a bonding force of 30 to 360 g/mm$^2$ and at a temperature of 200° to 400° C., for 1 to 5 seconds. As finger leads 41 are bonded to bump electrodes 16 in this manner, each gold bump 16b and solder 42 on the surface of its corresponding lead 41 are Au-Sn eutectic-bonded.

In this, case, fine V-shaped grooves 17 are formed on gold bump 16b so that solder 42 sticks to grooves 17. Thus, the solder is anchored to the rough surface of the gold bump, thereby ensuring high-reliability bonding.

In the prior art structure (FIG. 8), moreover, gold bump 5, along with under-bump layer 4 and insulating layer 3, spreads beyond the outer peripheral edge portion of electrode pad 2. If a pressure welding load is applied to bump electrode 5, therefore, fragile insulating layer 3 may often be broken at that portion thereof corresponding to the shoulder of the outer peripheral portion of pad 2, as indicated by symbol A. Such breakage of layer 3 would cause the electrode pad to be oxidized or constitute a fatal obstacle to proper operation of the internal circuit. According to the present invention, however, bump electrode 16 does not cover the outer peripheral edge portion of electrode pad 13, so that these troubles can be prevented completely.

In the embodiment described above, thin gold layer 16a is subjected to wet etching in order that gold removed by etching can be recovered for reuse. Naturally, the gold layer can be removed simultaneously with the under-bump layer by reactive-ion etching.

What is claimed is:

1. A method for forming a bump electrode to a semiconductor substrate, comprising the steps of:
providing a semiconductor substrate having thereon an insulating layer formed with an opening therein and an electrode pad whose central portion is exposed through said opening of said insulting layer;
forming an under-bump layer on said insulating layer and the portion of said electrode pad exposed through said opening of said insulating layer;
forming a single photoresist layer thicker than the thickness of the final bump electrode on an entire surface of said under-bump layer by putting on said under-bump layer a wet photoresist having a viscosity of hundreds of centipoises to approximately a thousand centipoises and spinning said semiconductor substrate;
forming an opening in said photoresist layer to said under-bump layer, such opening being of a size such that the peripheral edge portion of said opening in the photoresist layer is defined between the peripheral edge portion of said opening of said insulating layer and a peripheral edge portion of said electrode pad;
forming said bump electrode coupled to said under-bump layer by plating through the opening of said photoresist layer so that the top surface of said bump electrode is flush with or lower than that of said photoresist layer; and
removing said photoresist layer and the entire outer portion of said under-bump layer extending outwardly from the periphery of said bump electrode, said step of removing said under-bump layer includes an anistropic dry etching process.

2. The method according to claim 1, wherein said electrode pad, said under-bump layer, and said bump electrode are respectively made of gold, an alloy of titanium and tungsten, and a selected one of aluminum and an aluminum alloy.

3. The method according to claim 2, wherein said step of forming said bump electrode includes sputtering gold over the entire surface of said under-bump layer.

4. The method according to claim 1, wherein said step of removing said under-bump layer includes a reactive-ion etching process.

5. The method according to claim 4, wherein said step of removing said under-bump layer includes providing a reactive ion gas used for said reactive-ion etching that is a gas mixture of halide gas and chlorine-based gas.

6. The method according to claim 5, wherein said gas contains $SF_6$.

7. The method according to claim 5, wherein said gas contains $CFCl_3$.

8. The method according to claim 1, wherein said step of forming said bump electrode includes the process of forming fine V-shaped grooves on the top surface of said bump electrode by anisotropic etching.

9. The method according to claim 8, wherein said steps of forming V-shaped grooves and removing said under-bump layer are performed simultaneously.

10. A method for forming a bump electrode to a semiconductor substrate, comprising the steps of:

forming an under-bump layer on an entire surface of a semiconductor substrate which has an electrode pad and an insulating layer covering the periphery of said electrode pad;

forming a photoresist layer thicker than the thickness of the final bump electrode on an entire surface of said under-bump layer;

forming an opening in said photoresist layer to a size such that the peripheral edge portion of said opening in the photoresist layer is defined between a peripheral edge portion of an opening in said insulating layer and a peripheral edge portion of said electrode pad;

forming the bump electrode by plating through the opening in said photoresist layer so that the top surface of said bump electrode is flush with or lower than that of said photoresist layer;

removing said photoresist layer and, thereafter, applying a reactive-ion etching process for removing said under-bump layer on a portion of said insulating layer extending laterally of said bump electrode, and for forming fine V-shaped grooves on the top surface of said bump electrode, wherein the removal of the under-bump layer and the formation of the fine V-shaped grooves on the two surfaces of the bump electrode occur simultaneously.

11. The method according to claim 10, further including the step of bonding said bump electrode with an external terminal covered with solder.

12. The method according to claim 10, wherein said step of removing said under-bump layer includes providing a reactive ion gas used for said reactive-ion etching that is a gas mixture of halide gas and chlorine-based gas.

13. The method for forming a bump electrode of a semiconductor device according to claim 12, wherein said gas contains $SF_6$.

14. The method for forming a bump electrode of a semiconductor device according to claim 12, wherein said gas contains $CFCl_3$.

* * * * *